(12) United States Patent
Rao et al.

(10) Patent No.: US 8,315,081 B2
(45) Date of Patent: Nov. 20, 2012

(54) MEMORY CELL THAT INCLUDES MULTIPLE NON-VOLATILE MEMORIES

(75) Inventors: Hari M. Rao, San Diego, CA (US); Jung Pill Kim, San Diego, CA (US); Siamack Haghighi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 319 days.

(21) Appl. No.: 12/728,506

(22) Filed: Mar. 22, 2010

(65) Prior Publication Data

US 2011/0228595 A1    Sep. 22, 2011

(51) Int. Cl.
*G11C 11/00* (2006.01)

(52) U.S. Cl. ........ 365/148; 365/158; 365/154; 365/188; 365/189.08; 365/189.03; 365/189.04

(58) Field of Classification Search .................. 365/148, 365/154, 158, 188, 189.08, 189.03, 189.04
See application file for complete search history.

(56) References Cited

U.S. PATENT DOCUMENTS

| | | | |
|---|---|---|---|
| 6,172,531 B1 | 1/2001 | Aipperspach et al. | |
| 6,760,244 B2 * | 7/2004 | Yamada | 365/63 |
| 6,760,249 B2 * | 7/2004 | Chien | 365/154 |
| 6,788,605 B2 | 9/2004 | Sharma et al. | |
| 6,848,067 B2 * | 1/2005 | Perner | 714/729 |
| 6,914,806 B2 * | 7/2005 | Kunikiyo | 365/158 |
| 6,922,355 B2 * | 7/2005 | Hidaka | 365/158 |
| 7,245,522 B2 * | 7/2007 | Aoki | 365/158 |
| 7,359,232 B2 | 4/2008 | Niedermeier et al. | |
| 7,372,718 B2 * | 5/2008 | Nagao et al. | 365/148 |
| 7,382,646 B2 * | 6/2008 | Moore et al. | 365/163 |
| 7,394,717 B2 * | 7/2008 | Hidaka | 365/230.03 |
| 7,403,413 B2 * | 7/2008 | Liaw | 365/158 |
| 7,408,212 B1 * | 8/2008 | Luan et al. | 257/295 |
| 7,542,326 B2 * | 6/2009 | Yoshimura et al. | 365/148 |
| 7,571,287 B2 * | 8/2009 | Lee et al. | 711/149 |
| 7,577,021 B2 * | 8/2009 | Guo et al. | 365/158 |
| 7,583,528 B2 * | 9/2009 | Aoki | 365/158 |
| 7,684,227 B2 * | 3/2010 | Liu et al. | 365/148 |
| 7,885,095 B2 * | 2/2011 | Sakimura et al. | 365/158 |
| 7,898,842 B2 * | 3/2011 | Kuenemund | 365/154 |

(Continued)

FOREIGN PATENT DOCUMENTS

JP    2008135433 A    6/2008

(Continued)

OTHER PUBLICATIONS

International Search Report and Written Opinion—PCT/US2011/029477, ISA/EPO—Jul. 5, 2011.

*Primary Examiner* — Viet Q Nguyen

(74) *Attorney, Agent, or Firm* — Sam Talpalatsky; Michelle Gallardo; Jonathan T. Velasco

(57) ABSTRACT

A system and method to read and write data at a memory cell that includes multiple non-volatile memories is disclosed. In a particular embodiment, a memory device is disclosed that includes a plurality of memory cells, where at least one of the memory cells comprises a first non-volatile memory including a first resistive memory element and a second multi-port non-volatile memory including a second resistive memory element.

41 Claims, 7 Drawing Sheets

U.S. PATENT DOCUMENTS

| | | | |
|---|---|---|---|
| 7,961,005 B1 * | 6/2011 | Kim et al. | 326/46 |
| 7,995,378 B2 * | 8/2011 | Yoon et al. | 365/158 |
| 8,013,711 B2 * | 9/2011 | Wei et al. | 338/20 |
| 8,045,361 B2 * | 10/2011 | Lee et al. | 365/148 |
| 2004/0066669 A1 | 4/2004 | Ooishi | |
| 2004/0193782 A1 | 9/2004 | Bordui | |
| 2007/0091707 A1 | 4/2007 | Hidaka | |
| 2008/0084736 A1 | 4/2008 | Lee et al. | |
| 2009/0190391 A1 | 7/2009 | Itagaki et al. | |
| 2010/0072530 A1 | 3/2010 | Takizawa et al. | |
| 2010/0195362 A1 | 8/2010 | Norman | |

FOREIGN PATENT DOCUMENTS

| | | |
|---|---|---|
| WO | 2004084226 A1 | 9/2004 |
| WO | 2008150927 A3 | 12/2008 |
| WO | WO2009122519 A1 | 10/2009 |

* cited by examiner

MEMORY CELL THAT INCLUDES MULTIPLE NON-VOLATILE MEMORIES

I. FIELD

The present disclosure is generally related to a memory cell that includes multiple non-volatile memories.

II. DESCRIPTION OF RELATED ART

Advances in technology have resulted in smaller and more powerful computing devices. For example, there currently exist a variety of portable personal computing devices, including wireless computing devices, such as wireless telephones, personal digital assistants (PDAs), and paging devices that are small, lightweight, and easily carried by users. More specifically, wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application that can be used to access the Internet. As such, these wireless telephones can include significant computing capabilities.

The computing capabilities of a processor may be increased through the use of Simultaneous Multi-Threading (SMT). SMT provides for higher instructions per cycle (IPC) by enabling the issuance of multiple instructions from multiple threads in one cycle. Register files associated with a SMT processor are used to store the architectural "states" associated with each thread and may also support multiple read and write ports for performance. For example, in a central processing unit (CPU) system, multiple agents may attempt to access a common location in a register file in the same processor clock cycle. With multiple ports, a first agent does not need to wait for a second agent to complete a read/write operation before the first agent is able to conduct the read/write operation. Enabling both agents to access the common register via different ports leads to increased memory bandwidth for read and write operations.

Adding multiple ports to each memory cell of a RAM device increases the size of each memory cell. The increase in size of the memory cell due to adding additional ports may depend upon the type of the memory device. For example, adding an additional write port to a single port static random access memory (SRAM) cell to form a dual-port SRAM cell typically involves additional circuitry. A larger memory cell tends to increase delay and power usage, which is disadvantageous in many electronic devices.

III. SUMMARY

In a particular embodiment, an SMT cell (i.e., a multi-ported and multi-threaded memory cell) with multiple non-volatile memories is introduced. A multi-ported and multi-threaded magnetoresistive random access memory (MRAM) device is disclosed that has a smaller size than a standard SRAM counterpart. In addition, the non-volatile MRAM device includes non-volatile memory that enables the use of an instant-on architecture.

In a particular embodiment, a memory device is disclosed that includes a plurality of memory cells, where at least one of the memory cells comprises a first non-volatile memory including a first resistive memory element and a second non-volatile memory including a second resistive memory element.

In a particular embodiment, a system is disclosed that includes a processor and a plurality of memory cells accessible to the processor, where at least one of the memory cells comprises a first multi-port non-volatile memory including a first resistive memory element and a second multi-port non-volatile memory including a second resistive memory element.

In a particular embodiment, a method is disclosed that includes receiving first data and receiving second data at a single memory cell that comprises a first non-volatile memory and a second non-volatile memory. The method also includes storing the first data at a first resistive memory element of the first non-volatile memory and storing the second data at a second resistive memory element of the second non-volatile memory.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
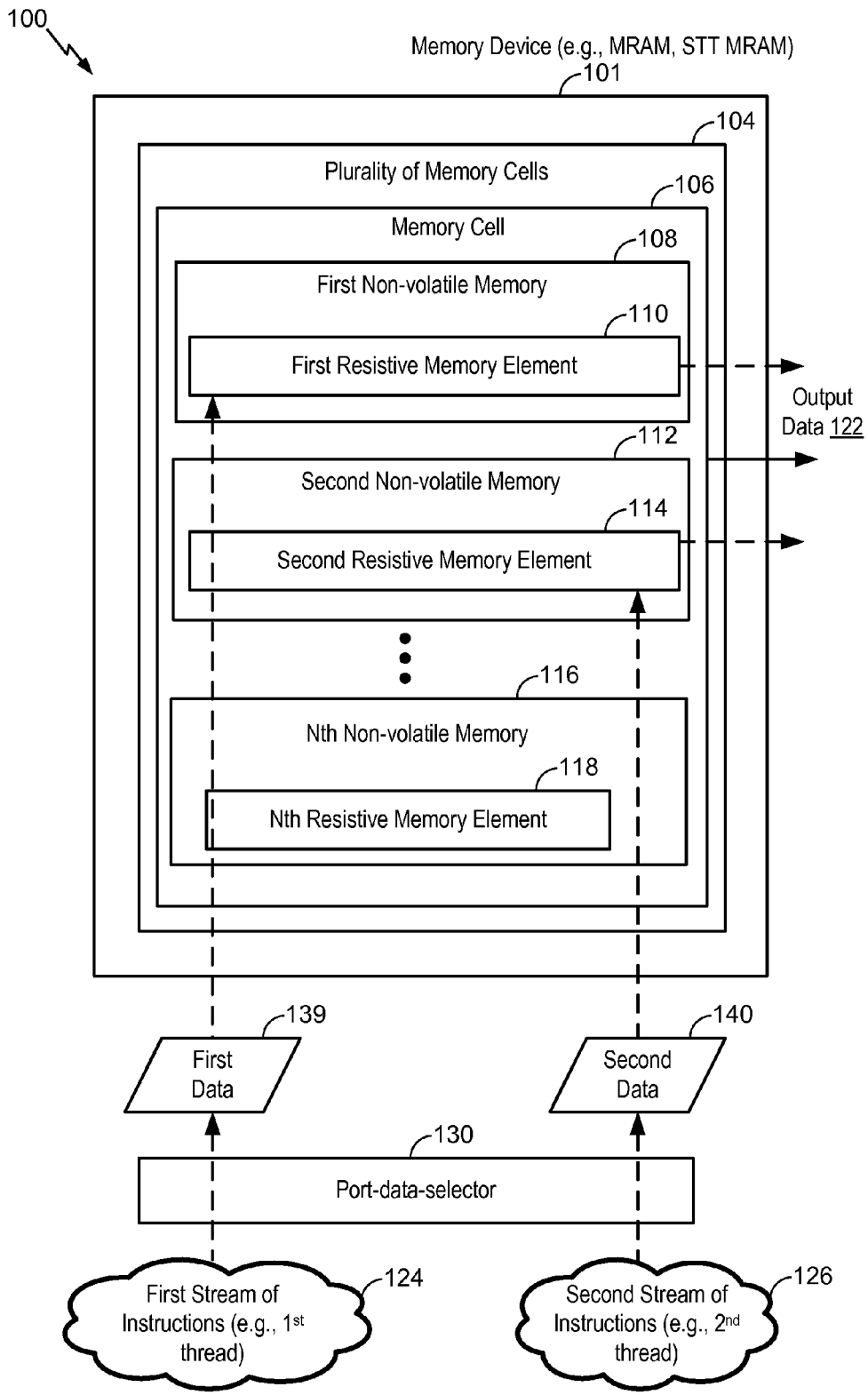
FIG. 1 is a block diagram of a particular illustrative embodiment of a system with a cell that includes multiple non-volatile memories.

FIG. 1 is a diagram of a first embodiment of a system with a cell that includes multiple non-volatile memories and is generally designated 100. The system 100 includes a memory device 101 that includes a port-data-selector 130 coupled to a plurality of memory cells 104 that includes a memory cell 106. The memory cell 106 includes a first non-volatile memory 108 that includes a first resistive memory element 110, a second non-volatile memory 112 that includes a second resistive memory element 114, and an Nth non-volatile memory 116 that includes an Nth resistive memory element 118.

In a particular embodiment, the memory cell 106 is responsive to a write operation and is responsive to first data 139 and second data 140 received from the port-data-selector 130. As part of the write operation, the memory cell 106 may be configured to store the first data 139 at the first non-volatile memory 108 and the second data 140 at the second non-volatile memory 112. For example, the first non-volatile memory 108 may store the first data 139 by setting a first resistance value of the first resistive memory element 110 to correspond to a logical "0" or a logical "1" value and the second non-volatile memory 112 may store the second data 140 by setting a second resistance value of the second resistive memory element 114.

In a particular embodiment, the memory cell 106 is responsive to a read operation to generate output data 122. The output data 122 may correspond to a particular resistive element 110, 114, 118 of the memory cell 106. For example, the output data 122 may be based on the first resistance value of the first resistive memory element 110. As another example, the output data 122 may be based on the second resistance value of the second resistive memory element 114.

In a particular embodiment, the port-data-selector 130 is responsive to the first stream of instructions 124 to generate the first data 139. The port-data-selector 130 may be configured to provide the first data 139 to the memory cell 106. The port-data-selector 130 is also responsive to the second stream of instructions 126 to generate the second data 140 and the port-data-selector 130 may be configured to provide the second data 140 to the memory cell 106.

In a particular embodiment, the memory device 101 is configured to implement SMT. For example, each non-volatile memory 108, 112, 116 may be configured to correspond to a particular stream of instructions. For example, the first non-volatile memory 108 may be configured to be associated with the first stream of instructions 124, and the second non-volatile memory 112 may be configured to be associated with the second stream of instructions 126. Each stream of instructions 124, 126 may correspond to one or more threads of a plurality of threads that are being processed by a processor (not shown). For example, the first stream of instructions 124 may be instructions associated with a first thread being processed by the processor, and the second stream of instructions 126 may be instructions associated with a second thread being processed by the processor.

In a particular embodiment, the memory device 101 is a magnetoresistive random access memory (MRAM) that is configured to write data using spin-torque-transfer (STT). The memory device 101 may be a single register file and the first non-volatile memory 108 and the second non-volatile memory 112 may each correspond to a common register. For example, the first non-volatile memory 108 may be configured to store first state information corresponding to the first stream of instructions 124, and the second non-volatile memory 112 may be configured to store second state information corresponding to the second stream of instructions 126.

During operation, the memory cell 106 is responsive to read and write operations. For example, the memory cell 106 may receive the first data 139 from the port-data-selector 130 to be stored at the first non-volatile memory 108. In response to receiving the first data 139, the first non-volatile memory 108 may store the first data 139 by setting the first resistance value of the first resistive memory element 110. During a read operation of the first non-volatile memory 108, the memory cell 106 may generate the output data 122 based on the first resistance value of the first resistive memory element 110. In a particular embodiment, the first data 139 corresponds to the first stream of instructions 124 and the output data 122 that is generated based on the first resistive memory element 110.

In a particular embodiment, the memory cell 106 receives the second data 140 from the port-data-selector 130 to be stored at the second non-volatile memory 112. In response to receiving the second data 140, the second non-volatile memory 112 may store the second data 140 as the second resistance value of the second resistive memory element 114. During the read operation of the second non-volatile memory 112, the memory cell 106 may generate the output data 122 based on the second resistance value of the second resistive memory element 114. In a particular embodiment, the second data 140 corresponds to the second stream of instructions 126. For example, the output data 122 generated based on the second resistive memory element 114 may correspond to the second stream of instructions 126.

In a particular embodiment, the memory device 101 is utilized as RAM for a processor. Storing state information (e.g., the first data 139 and the second data 140) in the non-volatile memories 108, 112, 116 of the memory device 101 enables the processor to implement an instant-on architecture. With instant-on architecture, the processor has immediate access to state information in RAM without having to load the state information into RAM. Non-volatile memories enable the memory device 101 to be powered off without losing the stored state information. Powering on the memory device 101 with an instant-on architecture, enables the processor to access the stored state information without having to load the state information from an external device functioning as non-volatile memory, thus reducing the start-up time of a system utilizing the processor and the memory device 101.

Figure 2:
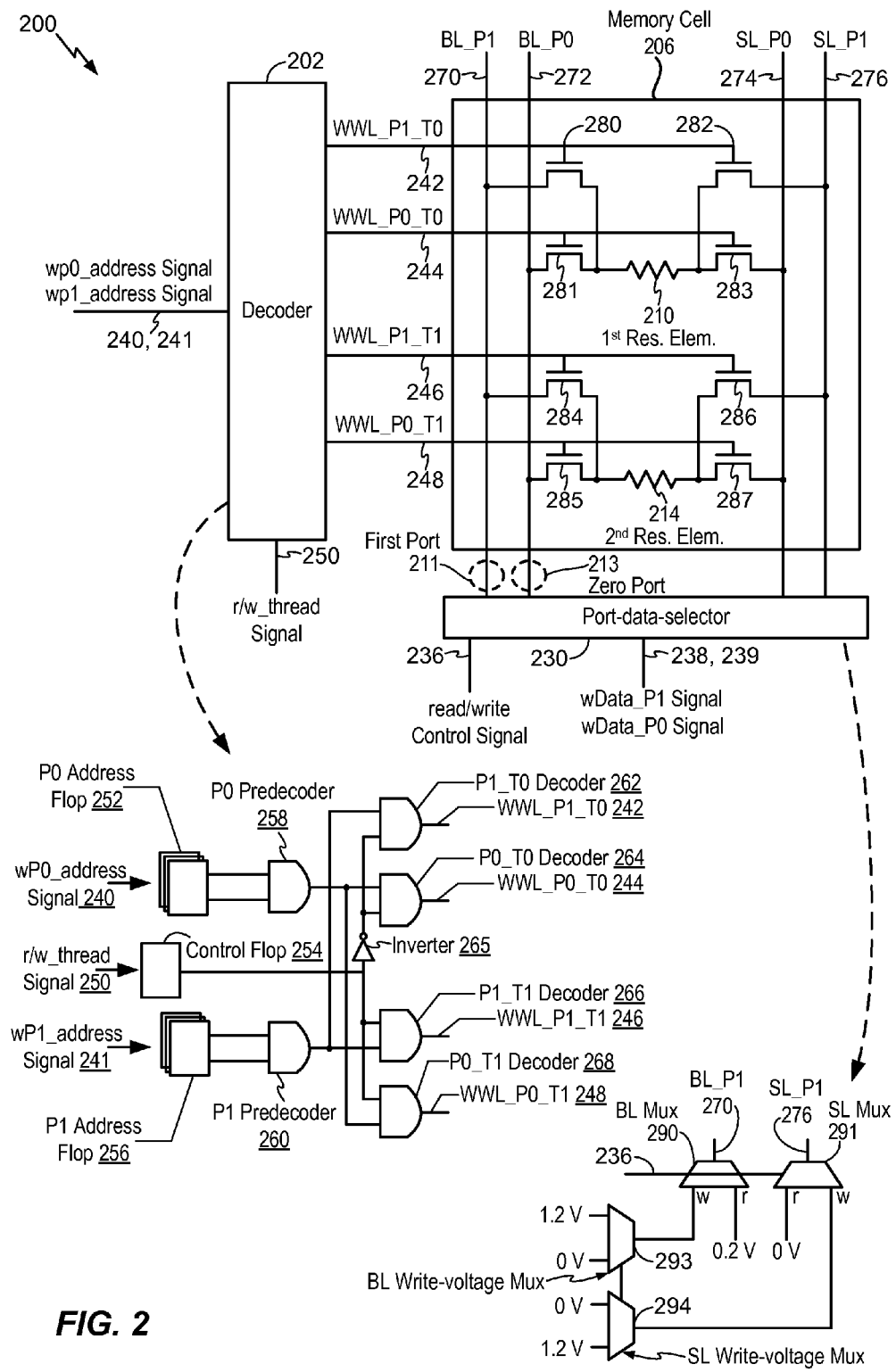
FIG. 2 is a diagram of a second illustrative embodiment of a system with a cell that includes multiple resistive elements.

Referring to FIG. 2, a diagram of a second embodiment of a system with a cell that includes multiple resistive elements, each resistive element accessible by multiple ports, is illustrated and is generally designated 200. The system 200 includes a memory cell 206 coupled to a decoder 202 and includes a port-data-selector 230. In a particular embodiment, the memory cell 206 is the memory cell 106 of FIG. 1 and the port-data-selector 230 is the port-data-selector 130 of FIG. 1.

In a particular embodiment, the decoder 202 is configured to provide control signals via word lines to enable the reading and writing of data from the memory cell 206. The decoder 202 may be configured to receive an input address directed to a particular port of the memory cell 206. For example, the input address may be a wp0_address signal 240 that is directed to a zero port 213 of the memory cell 206. As another example, the input address may be a wp1_address signal 241 that is directed to a first port 211 of the memory cell 206. The decoder 202 may be configured to receive a signal (e.g., r/w_thread signal 250) that indicates a particular thread that corresponds to the input address. For example, the r/w_thread signal 250 may indicate that a zero thread corresponds with the wp1_address signal 241. As another example, the r/w_thread signal 250 may indicate that a first thread corresponds with the wp0_address signal 240.

In a particular embodiment, the decoder 202 includes circuitry configured to process the input address based on the port and the thread corresponding to the input address. For example, the r/w_thread signal 250 corresponding to a particular thread and a wp0_address signal 240 corresponding to the zero port 213 may be received by the decoder 202. The wp0_address signal 240 may be received at a P0 address flop 252 coupled to a P0 predecoder 258 and the r/w_thread signal 250 may be received at a control flop 254. The output of the control flop 254 may be coupled to a P1_T1 decoder 266 and to a P0_T1 decoder 268. The inverse of the output of the control flop 254 may be coupled to a P1_T0 decoder 262 and to a P0_T0 decoder 264. The output of the control flop 254 may be inverted by an inverter 265 that outputs a voltage representing the opposite logic-level to its input. For example, the output of the inverter 265 may be a logical "1" in response to receiving an input of a logical "0" from the output of the control flop 254.

In a particular embodiment, the P0 predecoder 258 is an AND gate that is configured to output a high signal in response to receiving two high signals as input from the P0 address flop 252. The output of the P0 predecoder 258 may be transmitted to the P0_T0 decoder 264 and the P0_T1 decoder 268. The P0_T0 decoder 264 may be configured to output a signal on a word line (e.g., a WWL_P0_T0 244) in response to receiving a high signal from the output of the inverter 265 and the output of the P0 predecoder 258. The P0_T1 decoder 268 may be configured to output a signal on a word line (e.g., a WWL_P0_T1 248) in response to receiving a high signal from the output of the control flop 254 and the output of the P0 predecoder 258.

As another example, the decoder 202 may receive the r/w_thread signal 250 corresponding to a particular thread and a wp1_address signal 241 corresponding to the first port 211. The wp1_address signal 241 may be received at a P1 address flop 256 coupled to a P1 predecoder 260 and the r/w_thread signal 250 may be received at the control flop 254. In a particular embodiment, the P1 predecoder 260 is an AND gate that is configured to output a high signal in response to receiving two high signals as input from the P1 address flop 256. The output of the P1 predecoder 260 may be transmitted to the P1_T0 decoder 262 and to the P1_T1 decoder 266. The P1_T1 decoder 262 may be configured to output a signal on a word line (e.g., a WWL_P1_T0 242) in response to receiving a high signal from the output of the inverter 265 and the output of the P1 predecoder 260. The P1_T1 decoder 266 may be configured to output a signal on a word line (e.g., a WWL_P1_T1 246) in response to receiving a high signal from the output of the control flop 254 and the output of the P1 predecoder 260.

In a particular embodiment, the port-data-selector 230 is configured to receive a read/write control signal 236. The w/r control signal 236 may indicate whether the memory cell 206 is to perform a read operation or a write operation on a particular port. For example, the w/r control signal 236 may indicate that the read operation is to be performed on a first port 211 of the memory cell 206. As another example, the w/r control signal 236 may indicate that the write operation is to be performed on a zero port 213 of the memory cell 206. The port-data-selector 230 may be configured to receive input data for writing data onto the ports of the memory cell 206 during the write operation. In a particular embodiment, the input data also indicates a value to be stored. For example, the input data may be a wData_P1 signal 238 that indicates that the first port 211 will be used to write a data value representing a logical value of one. As another example, the input data may be a wData_P0 signal 239 that indicates that the zero port 213 will be used to write a data value representing a logical value of zero.

In a particular embodiment, the port-data-selector 230 includes circuitry configured to process the read/write control signal 236 and during the write operation, to process the input data (e.g., the wData_P1 signal 238 and the wData_P0 signal 239). The circuitry of the port-data-selector 230 may include a bit line (BL) multiplexer 290, a sense line (SL) multiplexer 291, a BL write-voltage multiplexer 293, and a SL write-voltage multiplexer 294. Although FIG. 2 depicts the circuitry for processing the first port 211 of the memory cell 206 for ease of explanation, the port-data-selector 230 may also include a corresponding BL multiplexer, SL multiplexer, BL write-voltage multiplexer, and SL write-voltage multiplexer for each port of the memory cell 206.

Both the BL multiplexer 290 and the SL multiplexer 291 may be configured to receive the read/write control signal 236. The read/write control signal 236 may determine whether the BL multiplexer 290 and the SL multiplexer 291 will be used in the read operation or the write operation. The output of the BL multiplexer 290 is connected to a bit line (e.g., a BL_P1 270) corresponding to the first port 211, and the output of the SL multiplexer 291 is connected to a sense line (e.g., a SL_P1 276) corresponding to the first port 211.

In response to receiving the read/write control signal 236 indicating a read operation, the BL multiplexer 290 may be configured to output a voltage of 0.2 V on the BL_P1 270 and the SL multiplexer 291 may be configured to output a voltage of 0 V on the SL_P1 276. In response to the read/write control signal 236 indicating a write operation, the BL multiplexer 290 may be configured to output a voltage to the BL_P1 270 based on the BL write-voltage multiplexer 293. In a particular embodiment, the output of the BL write-voltage multiplexer 293 is based on the input data of the port-data-selector 230. For example, the wData_P1 signal 238 may indicate that a data value of 1.2 V is to be stored in the memory cell 206 via the first port 211. The BL write-voltage multiplexer 293 may be configured to output 1.2V to the BL multiplexer 290 and the SL write-voltage multiplexer 294 may be configured to output 0V to the SL multiplexer 291. In a particular embodiment, an output of 1.2 V on the BL_P1 270 and 0 V on the SL_P1 276 results in a representation of 1.2 V being stored in one of the resistive elements of the memory cell 206. Although specific numerical values are described in the present disclosure as illustrative examples, it will be understood that the present disclosure is not limited to the specific values described and that other values may instead be used.

Alternatively, the wData_P1 signal 238 may indicate that a data value of 0 V is to be stored in the memory cell 206 via the first port 211. The BL write-voltage multiplexer 293 may be configured to output 0 V to the BL multiplexer 290 and the SL write-voltage multiplexer 294 may be configured to output 1.2 V to the SL multiplexer 291. In a particular embodiment, an output of 0 V on the BL_P1 270 and 1.2 V on the SL_P1 276 results in a representation of 0 V being stored in one of the resistive elements of the memory cell 206.

In a particular embodiment, the memory cell 206 is a SMT cell that is configured to store data in resistive elements. For example, the memory cell 206 may include a first resistive element 210 configured to store a first representation of data and a second resistive element 214 configured to store a second representation of data. The memory cell 206 may be configured to enable the first representation of data to be read from the first resistive element 210 and the second representation of data to be read from the second resistive element 214.

In a particular embodiment, the memory cell 206 includes circuitry to store and read the data stored in the resistive elements (e.g., the first resistive element 210 and the second resistive element 214). The memory cell 206 may include access transistors that control access to the resistive elements. The access transistors may be bipolar transistors or field effect transistors and may be configured as n-type or p-type. For example, the first resistive element 210 may be accessed by the first port 211 or the zero port 213. Access of the first resistive element 210 through the first port 211 is controlled by a BL_P1_T0 access transistor 280 and a SL_P1_T0 access transistor 282. Access of the first resistive element 210 through the zero port 213 is controlled by a BL_P0_T0 access transistor 281 and a SL_P1_T0 access transistor 283. Access of the second resistive element 214 through the first port 211 is controlled by a BL_P1_{13} T1 access transistor 284 and a SL_P1_T1 access transistor 286. Access of the second resistive element 214 through the zero port 213 is controlled by a BL_P0_T1 access transistor 285 and a SL_P1_T1 access transistor 287.

The access transistors of the memory cell 206 are connected to the word lines from the decoder 202 (e.g., the WWL_P1_T0 242, the WWL_P0_T0 244, the WWL_P1_T1 246, and the WWL_P0_T1 248), bit lines (e.g., the BL_P1 270 and a BL_P0 272), and sense lines (e.g., a SL_P0 274 and the SL_P1 276). For example, the BL_P1_T0 access transistor 280 may receive a signal from the WWL_P1_T0 242 and the BL_P1 270. In a particular embodiment, the BL_P1_T0 access transistor 280 may be an n-type JFET that includes a source, a gate, and a drain. The BL_P1_T0 access transistor 280 may receive the signal from the WWL_P1_T0 242 at the gate and the signal from the BL_P1 270 at the source. The drain of the BL_P1_T0 access transistor 280 may be connected to the first resistive element 210.

In a particular embodiment, the source of the SL_P1_T0 access transistor 282 is connected to the first resistive element 210, the gate to the WWL_P1_T0 242, and the drain to the SL_P1 276. The source of the BL_P0_T0 access transistor 281 is connected to the BL_P0 bit line 272, the gate to the WWL_P0_T0 244, and the drain to the first resistive element 210. The source of the SL_P1_T0 access transistor 283 is connected to first resistive element 210, the gate to WWL_P0_T0 244 and the drain to the SL_P0 274.

In a particular embodiment, the source of the BL_P1_T1 access transistor 284 is connected to BL_P1 270, the gate to the WWL_P1_T1 246, and the drain to the second resistive element 214. The source of the SL_P1_T1 access transistor 286 is connected to the second resistive element 214, the gate to the WWL_P1_T1 246 and the drain to the SL_P1 276. The source of the BL_P0_T1 access transistor 285 is connected to the BL_P0 bit line 272, the gate to the WWL_P0_T1 248, and the drain to the second resistive element 214. The source of the SL_P1_T1 access transistor 287 is connected the second resistive element 214, the gate to the WWL_P0_T1 248, and the drain to the SL_P0 274.

In a particular embodiment, the access transistors control access to the resistive elements of the memory cell 206. For example, access to the first resistive element 210 via the first port 211 is enabled by turning on both the BL_P1_T0 access transistor 280 and the SL_P1_T0 access transistor 282. The BL_P1_T0 access transistor 280 is configured to be turned on by the receipt of a signal from the decoder 202 via the WWL_P1_T0 242. The SL_P1_T0 access transistor 282 is configured to be turned on by the receipt of a signal over the WWL_P1_T0 242. Turning on the BL_P1_T0 access transistor 280 and the SL_P1_T0 access transistor 282 may enable current to flow through the first resistive element 210 via the first port 211 of the memory cell 206.

As another example, access to the first resistive element 210 via the zero port 213 is enabled by turning on the BL_P0_T0 access transistor 281 and the SL_P0_T0 access transistor 283. The BL_P0_T0 access transistor 281 is configured to be turned on by the receipt of a signal from the decoder 202 via the WWL_P0_T0 244. The SL_P0_T0 access transistor 283 is configured to be turned on by the receipt of a signal over the WWL_P0_T0 244. Turning on the BL_P0_T0 access transistor 281 and the SL_P0_T0 access transistor 283 may enable current to flow through the first resistive element 210 via the zero port 213 of the memory cell 206.

In a particular embodiment, access to the second resistive element 214 via the first port 211 is enabled by turning on the BL_P1_T1 access transistor 284 and the SL_P1_T1 access transistor 286. The BL_P1_T1 access transistor 284 is configured to be turned on by the receipt of a signal from the decoder 202 via the WWL_P1_T1 246. The SL_P1_T1 access transistor 286 is configured to be turned on by the receipt of a signal over the WWL_P1_T1 246. Turning on the BL_P1_T1 access transistor 284 and the SL_P1_T1 access transistor 286 may enable current to flow through the second resistive element 214 via the first port 211 of the memory cell 206.

As another example, access to the second resistive element 214 via the zero port 213 is enabled by turning on the BL_P0_T1 access transistor 285 and the SL_P0_T1 access transistor 287. The BL_P0_T1 access transistor 285 is configured to be turned on by the receipt of a signal from the decoder 202 via the WWL_P0_T1 248. The SL_P0_T1 access transistor 287 is configured to be turned on by the receipt of a signal over the WWL_P0_T1 248. Turning on the BL_P0_T1 access transistor 285 and the SL_P0_T1 access transistor 287 may enable current to flow through the second resistive element 214 via the zero port 213 of the memory cell 206.

During the write operation, the decoder 202 may generate an output signal in response to receiving the input address and the r/w_thread signal 250. The output signal may be directed to a particular word line based on a particular port indicated by the input address and a particular thread indicated by the r/w_thread signal 250. For example, the decoder 202 may receive the wp1_address signal 241 at the P1 address flop 256 and the control flop 254 may receive the r/w_thread signal 250 indicating the zero thread. A low signal as the r/w_thread signal 250 may indicate the zero thread and a high signal may indicate the first thread.

In a particular embodiment, the output of the P1 address flop 256 generates an output at the P1 predecoder 260, which is provided to the P1_T0 decoder 262 and the P1_T1 decoder 266. For example, the output of the P1 address flop 256 may be a high signal and the output of the inverter 265 may be zero. The P1_T1 decoder 266 may receive a low signal from the output of the inverter 265 and a high signal from the output of the P1 predecoder 260. The P1_T1 decoder 266 operating as an AND gate does not receive two high signals and therefore does not generate a high signal on the WWL_P1_T1 246. In response to receiving a high signal from the output of the inverter 265 and a high signal from the output of the P1 predecoder 260, the P1_T0 decoder 262 may generate a high signal on the WWL_P1_T0 242. A high signal on the WWL_P1_T0 242 may be received by the BL_P1_T0 access transistor 280 and the SL_P1_T0 access transistor 282.

In a particular embodiment, the read/write control signal 236 received by the port-data-selector 230 indicates that the write operation is to be performed by the memory cell 206. The port-data-selector 230 may receive the input data to be written during the write operation. In response to the read/write control signal 236 indicating the write operation, the BL multiplexer 290 may be configured to output a voltage to the BL bit line 232 based on the BL write-voltage multiplexer 293. In a particular embodiment, the output of the BL write-voltage multiplexer 293 is based on the input data of the port-data-selector 230. For example, the wData_P1 signal 238 may indicate that a data value of 1.2 V is to be stored in the memory cell 206 via the first port 211. The BL write-voltage multiplexer 293 may output 1.2V to the BL multiplexer 290 and the SL write-voltage multiplexer 294 may output 0V to the SL multiplexer 291.

In a particular embodiment, an output of 1.2 V on the BL_P1 270 and 0 V on the SL_P1 276 results in a representation of 1.2 V being stored in one of the resistive elements of the memory cell 206. Alternatively, the wData_P1 signal 238 may indicate that a representation of 0 V is to be stored in the memory cell 206 via the first port 211. The BL write-voltage multiplexer 293 may be configured to output 0 V to the BL multiplexer 290 and the SL write-voltage multiplexer 294 may be configured to output 1.2 V to the SL multiplexer 291.

An output of 0 V on the BL_P1 270 and 1.2 V on the SL_P1 276 may result in a representation of 0 V being stored in one of the resistive elements of the memory cell 206.

In a particular embodiment, the resistance values of the resistive elements indicate a representation of the data to be stored by the memory cell 206. For example, the first resistive element 210 may be a magnetic tunneling junction (MTJ) that includes layers aligned in a particular magnetic orientation. As current passes through the layers, the orientation of the layers increases or decreases the resistance of the MTJ.

In a particular embodiment, the BL_P1 270 has a first voltage and the SL_P1 276 may have a second voltage during the write operation on the first port 211. Whether the first voltage is greater than the second voltage may be based on what resistance value is to be written into the first resistive element 210. For example, the port-data-selector 230 may provide the BL_P1 270 with a voltage of 1.2 V and the SL_P1 276 with a voltage of 0 V. The current would flow from the BL_P1 bit line 270 through the first resistive element 210 to the SL_P1 276, aligning the magnetic moments of the layers of the MTJ in a particular direction. Alternatively, if the voltage of the BL_P1 270 is 0 V and the SL_P1 276 voltage is 1.2 V, then the current may flow from the SL_P1 276 through the first resistive element 210 to the BL_P0 bit line 272, aligning the magnetic moments of the layers of the first resistive element 210 in the opposite direction. If magnetic moments of the layers of the MTJ are in a parallel orientation, then resistance value of the MTJ is smaller than if the magnetic moments were in an anti-parallel orientation. A small resistance value of the MTJ (e.g., the first resistive element 210) may correspond with a first data representation and a large resistance value may correspond with a second data representation.

During the read operation, the decoder 202 may generate an output signal in response to receiving the input address and the r/w_thread signal 250. The output signal may be directed to a particular word line based on a particular port indicated by the input address and a particular thread indicated by the r/w_thread signal 250. For example, the decoder 202 may receive the wp1_address signal 241 at the P1 address flop 256 and the control flop 254 may receive the r/w_thread signal 250 indicating the zero thread. In a particular embodiment, a low signal as the r/w_thread signal 250 indicates the zero thread and a high signal may indicate the first thread. The output of the P1 address flop 256 may generate an output at the P1 predecoder 260, which is provided to the P1_T0 decoder 262 and the P1_T1 decoder 266. For example, the output of the P1 address flop 256 may be a high signal and the output of the inverter 265 may be zero.

In a particular embodiment, the P1_T1 decoder 266 receives a low signal from the output of the inverter 265 and a high signal from the output of the P1 predecoder 260. The P1_T1 decoder 266 operating as an AND gate does not receive two high signals and therefore does not generate a high signal on the WWL_P1_T1 246. In response to receiving a high signal from the output of the inverter 265 and a high signal from the output of the P1 predecoder 260, the P1_T0 decoder 262 may generate a high signal on the WWL_P1_T0 242. A high signal on the WWL_P1_T0 242 may be received by the BL_P1_T0 access transistor 280 and the SL_P1_T0 access transistor 282.

In a particular embodiment, the read/write control signal 236 received by the port-data-selector 230 indicates that the read operation is to be performed by the memory cell 206. In response to the read/write control signal 236 indicating the read operation, the BL multiplexer 290 may be configured to output a voltage of 0.2 V on the BL_P1 270 and the SL multiplexer 291 may be configured to output a voltage of 0 V on the SL_P1 276. In a particular embodiment, the BL_P1 270 provides the BL_P1_T0 access transistor 280 with 0.2 V and the SL_P1 276 provides the SL_P1_T0 access transistor 282 with 0 V. Current may flow from the BL_P1 270 through the first resistive element 210 to the SL_P1 276.

In a particular embodiment, sensor circuitry connected to the SL_P1 276 compares the current on the SL_P1 276 to a reference current to determine the resistance value of the first resistive element 210. For example, a large current may indicate a small resistance value and a small current may indicate a large resistance value. The resistance value of the first resistive element 210 may serve as an indication of the logical value of the stored element of the first resistive element. If magnetic moments of the layers of the MTJ (e.g., the first resistive element 210) are in a parallel orientation, then the detected resistance would be smaller than if the magnetic moments were in an anti-parallel orientation. For example, a large resistance value may represent a logical value of zero and a small resistance value may represent a logical value of one.

In a particular embodiment, the memory cell 206 is utilized as a RAM cell for a processor. Storing state information (e.g., the wData_P1 signal 238 and the wData_P0 signal 239) as resistive values in the resistive memory elements 210, 214 of the memory cell 206 enable a processor to implement instant-on architecture. With instant-on architecture, the processor has immediate access to state information in RAM without having to load the state information into RAM. Resistive memory elements enable the memory cell 206 to power off without losing the resistive values representing the state information. Powering on the memory cell 206 enables the processor to access the stored state information without having to load the state information into RAM from an external device functioning as a non-volatile memory, thus reducing the start-up time of a system utilizing the memory cell 206.

Figure 3:
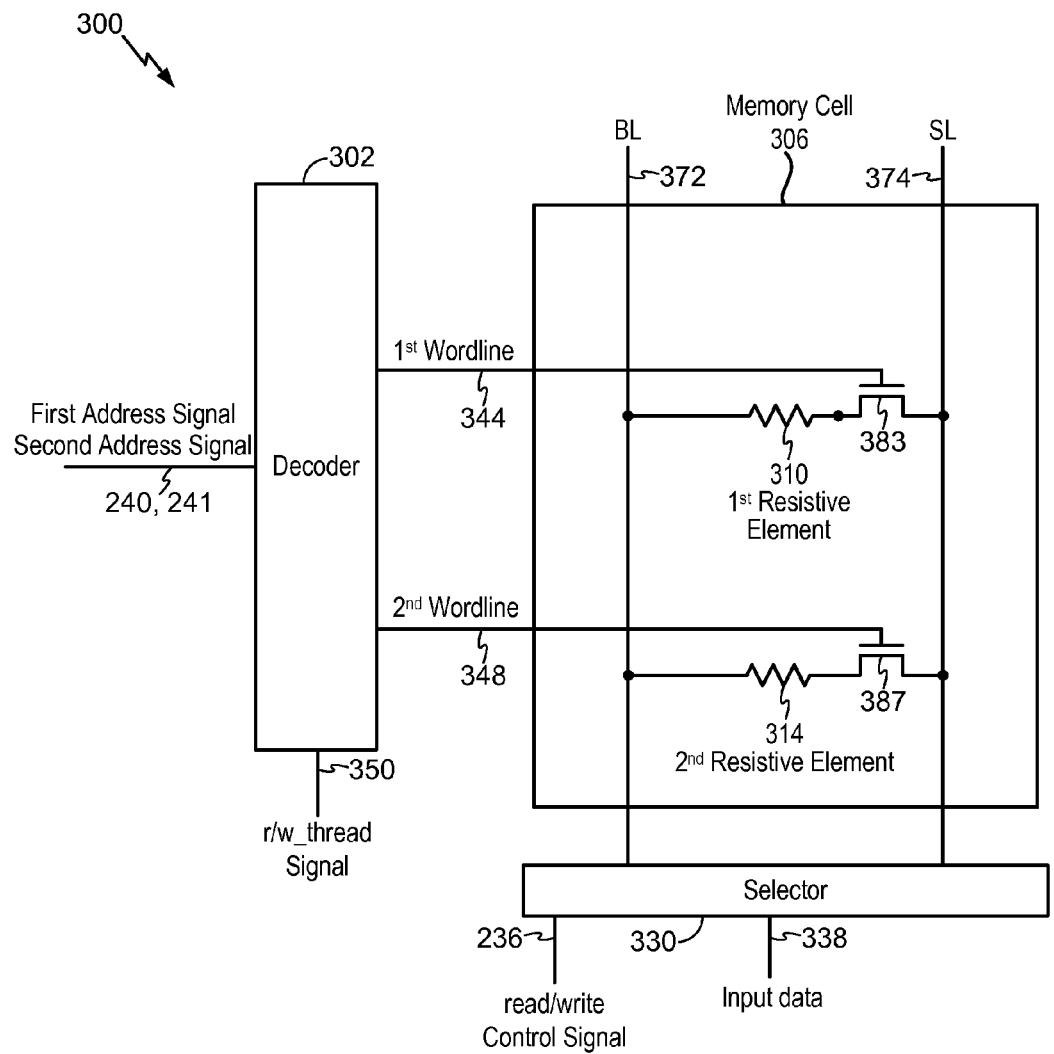
FIG. 3 is a diagram of a third illustrative embodiment of a system with a cell that includes multiple resistive elements.

Referring to FIG. 3, a diagram of a third embodiment of a system with a cell that includes multiple non-volatile memories is illustrated and is generally designated 300. The system 300 includes a memory cell 306 coupled to a decoder 302 and a selector 330. The memory cell 306 is single-ported, in contrast to the multi-ported memory cell 206 of FIG. 2.

In a particular embodiment, the decoder 302 is configured to provide control signals via word lines to enable the reading and writing of data from the memory cell 306. The decoder 302 may be configured to receive a signal (e.g., a r/w_thread signal 350) that indicates a particular thread that corresponds to an input address. For example, the r/w_thread signal 350 may indicate that a zero thread corresponds with a first address signal 240. As another example, the r/w_thread signal 350 may indicate that a first thread corresponds with a second address signal 241. The decoder 302 may be configured to generate a first control signal via a first word line 344 and a second control signal via a second word line 348.

In a particular embodiment, the selector 330 is configured to receive a read/write control signal 236. The w/r control signal 236 may indicate whether the memory cell 306 is to perform a read operation or a write operation. The selector 330 may be configured to receive input data 338 for writing data onto one or more of the resistive elements 310, 314 of the memory cell 306. In a particular embodiment, the input data 338 also indicates a value to be stored. For example, the input data 338 may indicate that a data value representing a logical value of one is to be written to the first resistive element 310. As another example, the input data 338 may indicate that a data value representing a logical value of zero is to be written to the second resistive element 314.

In a particular embodiment, the memory cell 306 is configured to store data in the resistive elements 310, 314. For example, the first resistive element 310 may be configured to store a first representation of data and the second resistive element 314 may be configured to store a second representation of data. The memory cell 306 may be configured to enable the first representation of data to be read from the first resistive element 310 and the second representation of data to be read from the second resistive element 314.

In a particular embodiment, the memory cell 306 includes circuitry to store and read the data stored in the resistive elements 310, 314. The memory cell 306 may include access transistors that control access to the resistive elements. The access transistors may be bipolar transistors or field effect transistors and may be configured as n-type or p-type. Access to the first resistive element 310 is controlled by a first access transistor 383. Access to the second resistive element 314 is controlled by a second access transistor 387.

The access transistors of the memory cell 306 are connected to the word lines from the decoder 302 (e.g., the first word line 344 and the second word line 348), resistive elements 310, 314, and sense line (SL) 374. For example, the first access transistor 383 may receive a signal from the first word line 344 to enable access to the first resistive element 310. As another example, the second access transistor 387 may receive a signal from the second word line 348 to enable access to the second resistive element 314. In a particular embodiment, the access transistors 383, 387 may be n-type FETs that each includes a source, a gate, and a drain. For example, the first access transistor 383 may receive the signal from the first word line 344 at the gate and a signal from the first resistive element 310 at the source. The drain of the first access transistor 383 may be connected to the SL 374. As another example, the gate of the second access transistor 387 may connected to the second word line 348, the source to the second resistive element 314, and the drain to the sense line 374.

In a particular embodiment, the access transistors 383, 387 control access to the resistive elements 310, 314 of the memory cell 306. For example, access to the first resistive element 310 is enabled by turning on the first access transistor 383. The first access transistor 383 is configured to be turned on by the receipt of a signal from the decoder 302 via the first word line 344. Turning on the first access transistor 383 may enable current to flow through the first resistive element 310 of the memory cell 306. As another example, access to the second resistive element 314 is enabled by turning on the second access transistor 387. The second access transistor 387 is configured to be turned on by the receipt of a signal from the decoder 302 via the second word line 348. Turning on the second access transistor 387 may enable current to flow through the second resistive element 314 of the memory cell 306.

During the write operation, the decoder 302 may generate an output signal in response to receiving the input address and the r/w_thread signal 350. The output signal may be directed to a particular word line indicated by the input address and a particular thread indicated by the r/w_thread signal 350.

In a particular embodiment, the resistance values of the resistive elements indicates a representation of the data to be stored by the memory cell 306. For example, the first resistive element 310 may be a magnetic tunnel junction (MTJ) that includes layers aligned in a particular magnetic orientation. As current passes through the layers, the orientation of the layers increases or decreases the resistance of the MTJ. If magnetic moments of the layers of the MTJ are in a parallel orientation, then the resistance value of the MTJ is smaller than if the magnetic moments were in an anti-parallel orientation. A small resistance value of the MTJ (e.g., the first resistive element 310) may correspond with a first data representation and a larger resistance value may correspond with a second data representation.

During a read operation, the decoder 302 may generate an output signal in response to receiving the input address and the r/w_thread signal 350. The output signal may be directed to a particular word line based on the input address and a particular thread indicated by the r/w_thread signal 350. The read/write control signal 236 received by the selector 330 may indicate that the read operation is to be performed by the memory cell 306.

In a particular embodiment, sensor circuitry (not shown) connected to the sense line 374 compares the current on the sense line 374 to a reference circuit to determine the resistance value of the first resistive element 310. For example, a large current may indicate a small resistance value and a small current may indicate a large resistance value. For example, the resistance value of the first resistive element 310 may serve as an indication of the logical value stored at the first resistive element 310. If magnetic moments of the layers of the MTJ (e.g., the first resistive element 310) are in a parallel orientation, then the detected resistance would be smaller than if the magnetic moments were in an anti-parallel orientation. For example, a large resistance value may represent a logical value of zero and a small resistance value may represent a logical value of one.

In a particular embodiment, the memory cell 306 is utilized as a RAM cell for a processor. Storing state information (e.g., the input data 338) as resistance values in the resistive elements 310, 314 of the memory cell 306 enables a processor to implement instant-on architecture. With instant-on architecture, the processor has immediate access to state information in RAM without having to load the state information into RAM. Resistive elements enable the memory cell 306 to power off without losing the resistance values representing the state information. Powering on the memory cell 306 enables the processor to access the stored state information without having to load the state information into RAM from an external device functioning as a non-volatile memory, thus reducing the start-up time of a system utilizing the memory cell 306.

Figure 4:
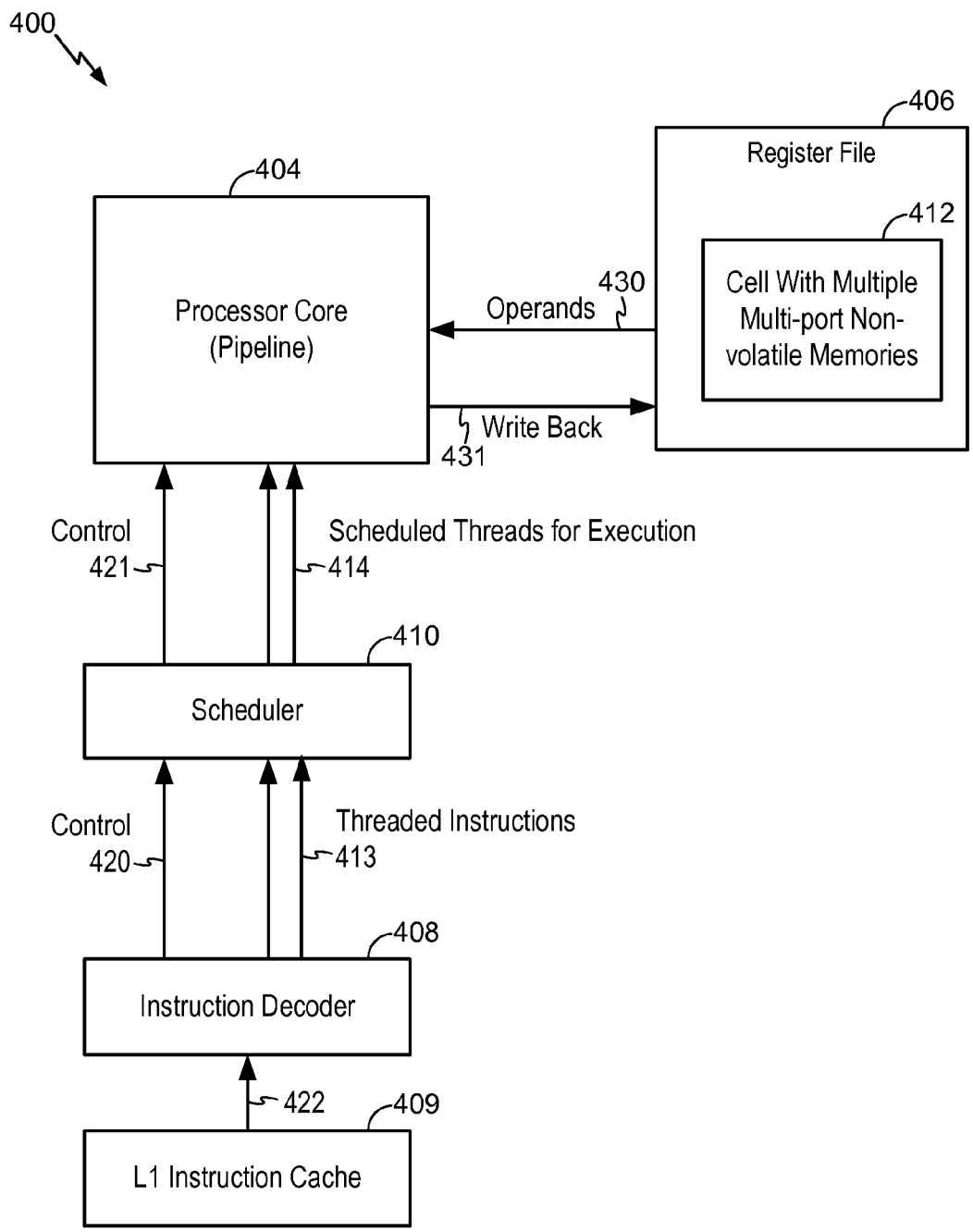
FIG. 4 is a block diagram of a fourth illustrative embodiment of a system with a cell that includes multiple non-volatile memories.

Referring to FIG. 4, a diagram of an embodiment of a system with a SMT cell that includes multiple multi-port non-volatile memories is illustrated and is generally designated 400. The system 400 includes a processor core 404, an instruction decoder 408, a scheduler 410, an instruction cache 409, and a register file 406 that includes at least one cell with multiple multi-port non-volatile memories 412. The processor core 404 is coupled to the register file 406 and the scheduler 410. The scheduler 410 is coupled to the instruction decoder 408, which is coupled to the instruction cache 409.

In a particular embodiment, the instruction decoder 408 receives instructions 422 from the instruction cache 409. The instruction decoder 408 may decode the instructions 422 and generate threaded instructions 413 and one or more control signals 420 to be provided to the scheduler 410.

The scheduler 410 may receive the threaded instructions 413 and the control signals 420. The scheduler 410 may be configured to schedule threads 414 for execution at the processor core 404. In a particular embodiment, the scheduler 410 is configured to schedule at least two instruction streams (e.g., the scheduled threads 414) to be processed substantially concurrently.

In a particular embodiment, the processor core 404 is configured to retrieve operands 430 from the register file 406 in response to receiving the scheduled threads 414 and one or more control signals 421 from the scheduler 410. For example, the operands 430 may include data from a register that includes the cell with multiple multi-port non-volatile memories 412. The processor core 404 may generate data based on an execution of the scheduled threads 414 with the operands 430. The processor core 404 may write back 431 the generated data to the register file 406.

In a particular embodiment, the cell with multiple multi-port non-volatile memories 412 may be the memory cell 106 of FIG. 1 or the memory cell 206 of FIG. 2. For example, the first non-volatile memory 108 may correspond to a first one of the scheduled threads 414 and the second non-volatile memory 112 may correspond to a second one of the scheduled threads 414. In a particular embodiment, the cell of multiple multi-port non-volatile memories 412 stores one bit of a register for each thread. For example, one bit of an operand may be stored in the cell of multiple multi-port non-volatile memories 412. During a read operation, the register file 406 may output operands (e.g., the operands 430) corresponding to the scheduled threads 414. During the write back 431, the register file 406 may store data received from the processor core 404.

In a particular embodiment, the register file 406 is utilized as RAM for the processor core 404. Storing state information (e.g., data received during the write back 431) in the cell with multiple multi-port non-volatile memories 412 of the register file 406 enables instant-on architecture to be implemented in the register file 406. Non-volatile memories enable the register file 406 to power off without losing the stored state information. Powering on the register file 406 enables the processor core 404 to access the stored state information without having to load the state information into the register file 406 from an external device functioning as non-volatile memory, thus reducing the start-up time of the system 400 utilizing the processor core 404 and the register file 406.

Figure 5:
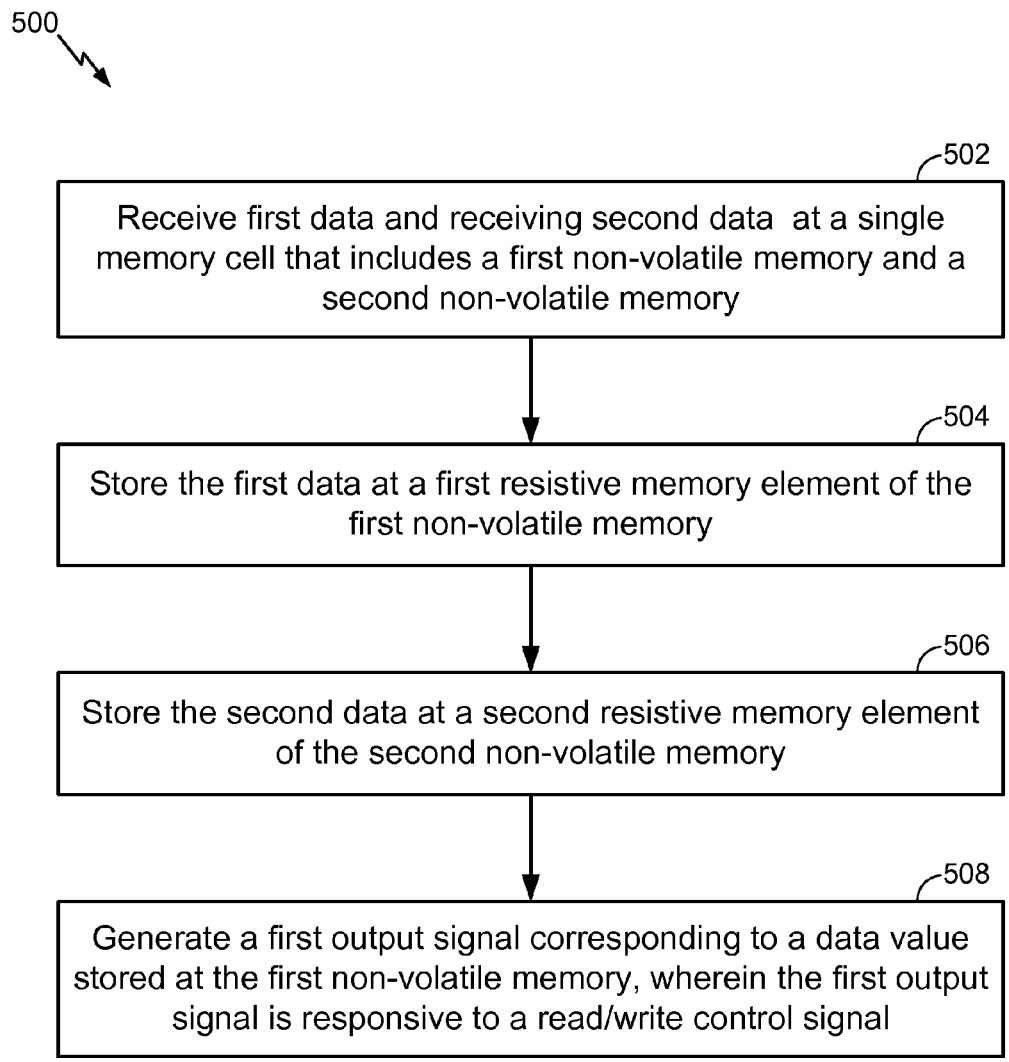
FIG. 5 is a flow chart of a particular illustrative embodiment of a method of operating a cell that includes multiple non-volatile memories.

FIG. 5 is a flow diagram of a first embodiment of a method 500 of operating a cell that includes multiple multi-port non-volatile memories. In a particular embodiment, the method 500 is performed by any of the systems of FIGS. 1-4, or any combination thereof. The method 500 includes receiving first data and receiving second data at a single memory cell that includes a first non-volatile memory and a second non-volatile memory, at 502. For instance, the memory cell 106 of FIG. 1 may receive the first data 139 at the single memory cell 106 that includes the first non-volatile memory 108 and the second non-volatile memory 112. In a particular embodiment, the first non-volatile memory is a first multi-port non-volatile memory and the second non-volatile memory is a second multi-port non-volatile memory. The method 500 also includes storing the first data at a first resistive memory element of the first non-volatile memory, at 504. For instance, the memory cell 106 of FIG. 1 may store the first data 139 at the first resistive memory element 110 of the first non-volatile memory 108. The method 500 also includes storing the second data at a second resistive memory element of the second non-volatile memory, at 506. For instance, the memory cell 106 of FIG. 1 may store the second data 140 at the second resistive memory element 114 of the second non-volatile memory 112.

In a particular embodiment, the method 500 optionally includes generating a first output signal corresponding to a data value stored at the first non-volatile memory, where the first output signal is responsive to a read/write control signal, at 508. For instance, the memory cell 106 of FIG. 1 may generate the first output signal (i.e., the output data 122) corresponding to a data value stored at the first non-volatile memory 108, where the first output signal (i.e., the output data 122) is responsive to the read/write control signal (e.g., read/write control signal 236 of FIG. 2).

The method of FIG. 5 may be performed at a processor integrated into an electronic device. For example, as will be described with respect to FIG. 6, the first data and the second data may be received and stored by a computer or other electronic device. Alternatively, or in addition, one of skill in the art will recognize that the method 500 of FIG. 5 may be implemented or initiated by a field programmable gate array (FPGA), an application-specific integrated circuit (ASIC), a central processing unit (CPU), a digital signal processor (DSP), a controller, another hardware device, or any combination thereof.

Figure 6:
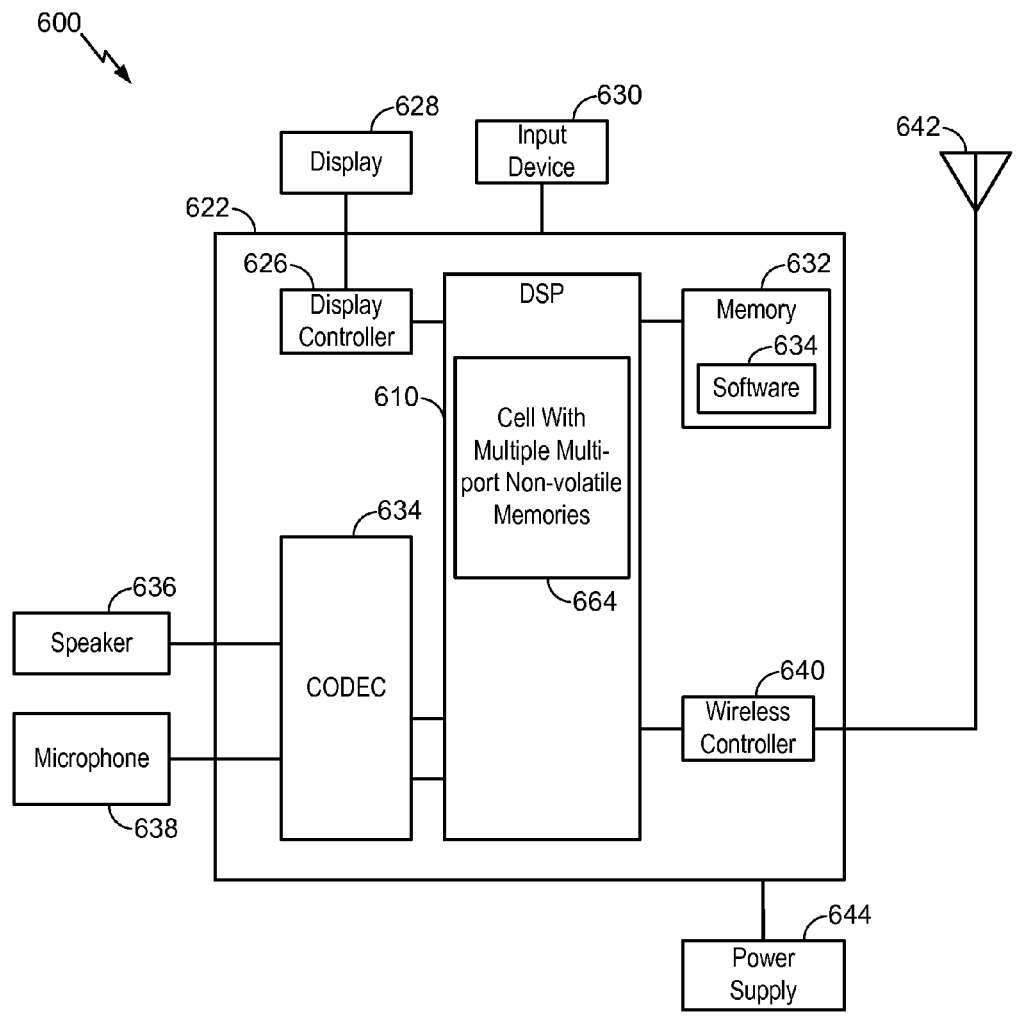
FIG. 6 is a block diagram of a particular embodiment of a wireless communication device that includes a cell with multiple multi-port non-volatile memories.

FIG. 6 is a block diagram of an embodiment of a wireless communication device 600 having a cell with multiple multi-port non-volatile memories 664. The wireless communication device 600 may be implemented as a portable wireless electronic device that includes a processor 610, such as a digital signal processor (DSP), coupled to a memory 632.

The memory 632 may include a computer readable medium that stores instructions (e.g., software 634) that are executable by a processor, such as the processor 610. For example, the software 634 may include instructions that are executable by a computer to receive first data and receive second data at a single memory cell, such as the cell with multiple multi-port non-volatile memories 664, that includes a first multi-port non-volatile memory and a second multi-port non-volatile memory. The software 634 may also include instructions that are executable by the computer to store the first data at a first resistive memory element of the first multi-port non-volatile memory. The software 634 may also include instructions that are executable by the computer to store the second data at a second resistive memory element of the second multi-port non-volatile memory.

In an illustrative example, the cell with multiple multi-port non-volatile memories 664 includes one or more of the modules or apparatuses of FIGS. 1-4, operates in accordance with FIG. 5, or any combination thereof. The cell with multiple multi-port non-volatile memories 664 may be at the processor 610 or may be at a separate device.

In a particular embodiment, a display controller 626 is coupled to the processor 610 and to a display device 628. A coder/decoder (CODEC) 634 can also be coupled to the processor 610. A speaker 636 and a microphone 638 can be coupled to the CODEC 634. A wireless controller 640 can be coupled to the processor 610 and to a wireless antenna 642. The cell with multiple multi-port non-volatile memories 664 is coupled to the wireless controller 640, the CODEC 634, and the display controller 626. In a particular embodiment, the cell with multiple multi-port non-volatile memories 664 is configured to store data related to the display controller 626, the CODEC 634, and the wireless controller 640.

In a particular embodiment, the signal processor 610, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display device 628, the input device 630, the speaker 636, the microphone 638, the wireless antenna 642, and the power supply 644 are external to the system-on-chip device 622. However, each of the display device 628, the input device 630, the speaker 636, the microphone 638, the wireless antenna 642, and the power supply 644 can be coupled to a component of the system-on-chip device 622, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Figure 7:
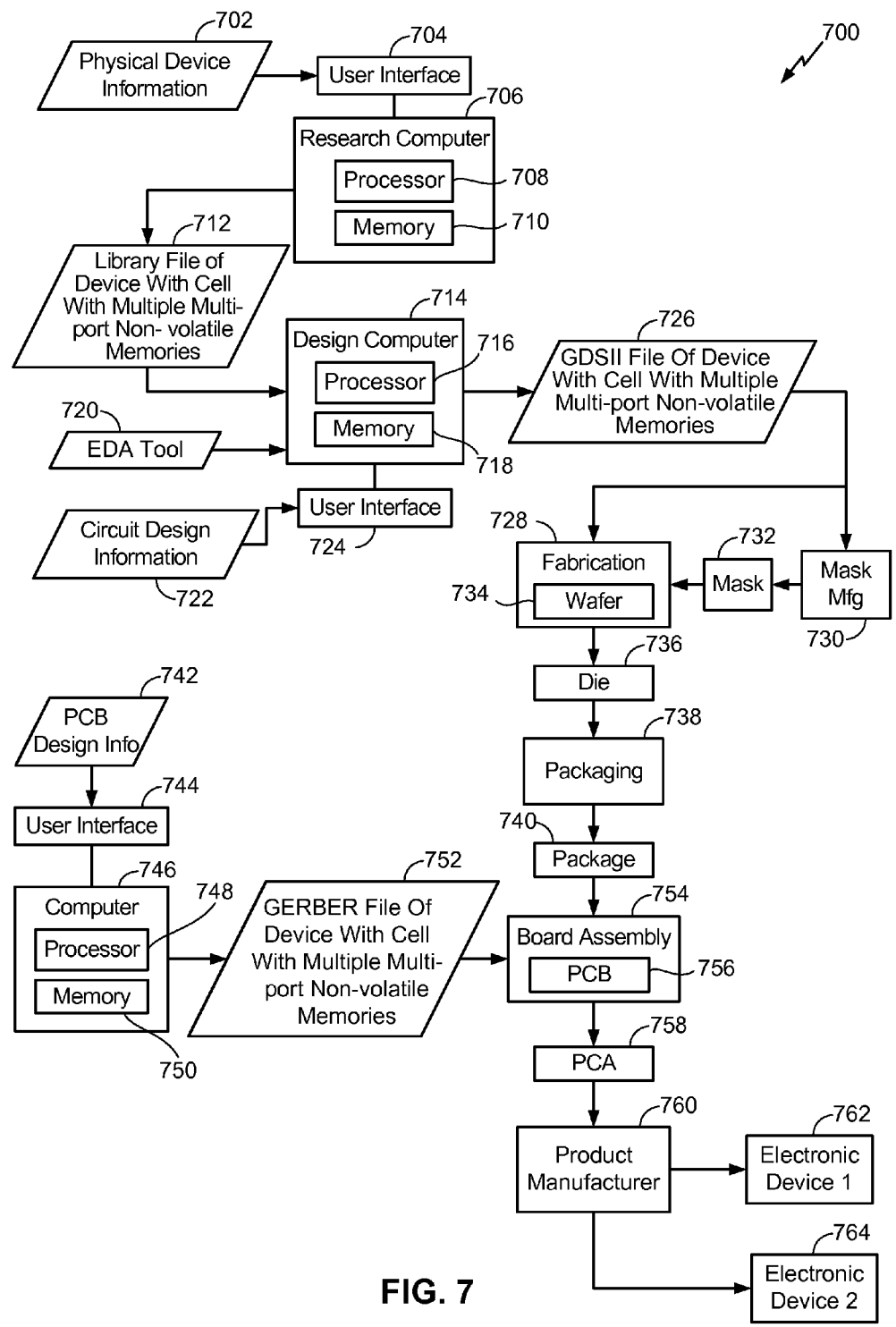
FIG. 7 is a data flow diagram illustrating a manufacturing process for use with a device that includes a cell that includes multiple multi-port non-volatile memories.

FIG. 7 depicts a particular illustrative embodiment of an electronic device manufacturing process 700. Physical device information 702 is received at the manufacturing process 700, such as at a research computer 706. The physical device information 702 may include design information representing at least one physical property of a semiconductor device, such as the system 100 of FIG. 1, the system 200 of FIG. 2, the system 300 of FIG. 3, the system 400 of FIG. 4, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including a device that includes the memory cell 106 of FIG. 1 (e.g., the apparatus 100 of FIG. 1), a device that includes the memory cell 206 of FIG. 2 (e.g., the apparatus 200 of FIG. 2), a device that includes the memory cell 306 of FIG. 3 (e.g. the apparatus 300 of FIG. 3), a device that includes the cell with multiple multi-port non-volatile memories 412 of FIG. 4 (e.g., the apparatus 400 of FIG. 4), or any combination thereof, that is provided to use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including a device that includes the memory cell 106 of FIG. 1 (e.g., the apparatus 100 of FIG. 1), a device that includes the memory cell 206 of FIG. 2 (e.g., the apparatus 200 of FIG. 2), a device that includes the memory cell 306 of FIG. 3 (e.g. the apparatus 300 of FIG. 3), a device that includes the cell with multiple multi-port non-volatile memories 412 of FIG. 4 (e.g., the apparatus 400 of FIG. 4), or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as a device that includes the memory cell 106 of FIG. 1 (e.g., the apparatus 100 of FIG. 1), a device that includes the memory cell 206 of FIG. 2 (e.g., the apparatus 200 of FIG. 2), a device that includes the memory cell 306 of FIG. 3 (e.g. the apparatus 300 of FIG. 3), a device that includes the cell with multiple multi-port non-volatile memories 412 of FIG. 4 (e.g., the apparatus 400 of FIG. 4), or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the memory cell 106 of FIG. 1, the memory cell 206 of FIG. 2, the cell with multiple multi-port non-volatile memories 312 of FIG. 3, the cell with multiple multi-port non-volatile memories 412 of FIG. 4, or any combination thereof, in addition to other circuits or information. To illustrate, the data file may include information corresponding to a system-on-chip (SOC) that includes the memory cell 106 of FIG. 1 and that also includes additional electronic circuits and components within the SOC.

The GDSII file 726 may be received at a fabrication process 728 to manufacture the memory cell 106 of FIG. 1, the memory cell 206 of FIG. 2, the memory cell 306 of FIG. 3, the cell with multiple multi-port non-volatile memories 412 of FIG. 4, or any combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes a circuit including a device that includes the memory cell 106 of FIG. 1 (e.g., the apparatus 100 of FIG. 1), a device that includes the memory cell 206 of FIG. 2 (e.g., the apparatus 200 of FIG. 2), a device that includes the memory cell 306 of FIG. 3 (e.g. the apparatus 300 of FIG. 3), a device that includes the cell with multiple multi-port non-volatile memories 412 of FIG. 4 (e.g., the apparatus 400 of FIG. 4), or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the memory cell 106 of FIG. 1, the memory cell 206 of FIG. 2, memory cell 306 of FIG. 3, the cell with multiple multi-port non-volatile memories 412 of FIG. 4, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the memory cell 106 of FIG. 1, the memory cell 206 of FIG. 2, memory cell 306 of FIG. 3, the cell with multiple multi-port non-volatile memories 412 of FIG. 4, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer, into which the at least one controllable energy consuming module is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the memory cell 106 of FIG. 1 (e.g., the apparatus 100 of FIG. 1), a device that includes the memory cell 206 of FIG. 2 (e.g., the apparatus 200 of FIG. 2), a device that includes the memory cell 306 of FIG. 3 (e.g. the apparatus 300 of FIG. 3), a device that includes the cell with multiple multi-port non-volatile memories 412 of FIG. 4 (e.g., the apparatus 400 of FIG. 4), or any combination thereof, may be fabricated, processed, and incorporated into an electronic device, as described in the illustrative process 700. One or more aspects of the embodiments disclosed with respect to FIGS. 1-4 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends on the particular application and design constraints imposed on the overall system. Skilled artisans may implement the described functionality in varying ways with each particular application, but such implementation decisions should not be interpreted as causing a departure from the scope of the present disclosure.

A software module may reside in random access memory (RAM), a magnetoresistive random access memory (MRAM), a spin-torque-transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A memory device comprising:
   a plurality of memory cells, wherein at least one of the memory cells comprises:
      a first non-volatile memory including a first resistive memory element; and
      a second non-volatile memory including a second resistive memory element, wherein the first non-volatile memory and the second non-volatile memory each include multiple ports and wherein the first non-volatile memory is associated with a first thread and the second non-volatile memory is associated with a second thread.

2. The memory device of claim 1, wherein the at least one of the memory cells is coupled to a decoder.

3. The memory device of claim 1, wherein a bit line controller coupled to the at least one of the memory cells is responsive to a read/write control input.

4. The memory device of claim 2, wherein the decoder is configured to perform port and thread decoding.

5. The memory device of claim 2, wherein the decoder has a thread selection input.

6. The memory device of claim 2, wherein the decoder is configured to receive a port address input and a port selection input.

7. The memory device of claim 1, wherein the memory device is a Magnetoresistive Random Access Memory (MRAM).

8. The memory device of claim 7, wherein the MRAM is configured to write data using spin-torque-transfer (STT).

9. The memory device of claim 1, wherein the first non-volatile memory and the second non-volatile memory each correspond to a common location within a single register file, wherein the first non-volatile memory stores first state information corresponding to a first stream of instructions and the second non-volatile memory stores second state information corresponding to a second stream of instructions.

10. The memory device of claim 1, integrated in at least one semiconductor die.

11. The memory device of claim 1, further comprising a device selected from a group consisting of a set top box, a music player, a video player, an entertainment unit, a navigation device, a communications device, a personal digital assistant (PDA), a fixed location data unit, and a computer, into which the memory device is integrated.

12. A system comprising:
a processor;
a plurality of memory cells accessible to the processor, wherein at least one of the memory cells comprises:
  a first multi-port non-volatile memory including a first resistive memory element; and
  a second multi-port non-volatile memory including a second resistive memory element; and
a decoder configured to receive an address signal and responsive to a selector signal to provide access to at least one of the first multi-port non-volatile memory and the second multi-port non-volatile memory.

13. The system of claim 12, further comprising a scheduler to select a first instruction stream from a plurality of instructions streams and to provide an indication of the selected first instruction stream to the processor.

14. The system of claim 13, wherein the scheduler is configured to schedule at least two instruction streams of the plurality of instruction streams to be processed substantially concurrently.

15. The system of claim 12, integrated in at least one semiconductor die.

16. The system of claim 12, further comprising a device selected from a group consisting of a set top box, a music player, a video player, an entertainment unit, a navigation device, a communications device, a personal digital assistant (PDA), a fixed location data unit, and a computer, into which the memory device is integrated.

17. A method comprising:
receiving first data and receiving second data at a single memory cell that comprises a first non-volatile memory and a second non-volatile memory;
storing the first data at a first resistive memory element of the first non-volatile memory; and
storing the second data at a second resistive memory element of the second non-volatile memory, wherein the first non-volatile memory and the second non-volatile memory each include multiple ports and wherein the first non-volatile memory is associated with a first thread and the second non-volatile memory is associated with a second thread.

18. The method of claim 17, wherein the first non-volatile memory is a first multi-port non-volatile memory and wherein the second non-volatile memory is a second multi-port non-volatile memory.

19. The method of claim 18, further comprising generating a first output signal corresponding to a data value stored at the first multi-port non-volatile memory, wherein the first output signal is responsive to a read/write control signal.

20. The method of claim 19, wherein the read/write control signal is received at the memory cell.

21. The method of claim 17, wherein the first data and the second data are received from a port-data-selector.

22. The method of claim 17, wherein receiving and storing the first data and the second data are performed by a processor integrated into an electronic device.

23. An apparatus comprising:
means for receiving first data and receiving second data at a single memory cell that comprises a first multi-port non-volatile memory and a second multi-port non-volatile memory;
means for storing the first data at a first resistive memory element of the first multi-port non-volatile memory; and
means for storing the second data at a second resistive memory element of the second multi-port non-volatile memory, wherein the first multi-port non-volatile memory is associated with a first thread and the second multi-port non-volatile memory is associated with a second thread.

24. The memory device of claim 23, integrated in at least one semiconductor die.

25. The memory device of claim 23, further comprising a device selected from a group consisting of a set top box, a music player, a video player, an entertainment unit, a navigation device, a communications device, a personal digital assistant (PDA), a fixed location data unit, and a computer, into which the memory device is integrated.

26. A method comprising:
a first step for receiving first data and receiving second data at a single memory cell that comprises a first multi-port non-volatile memory and a second multi-port non-volatile memory;
a second step for storing the first data at a first resistive memory element of the first multi-port non-volatile memory; and
a third step for storing the second data at a second resistive memory element of the second multi-port non-volatile memory, wherein the first multi-port non-volatile memory is associated with a first thread and the second multi-port non-volatile memory is associated with a second thread.

27. The method of claim 26, wherein the first step, the second step, and the third step are performed by a processor integrated into an electronic device.

28. A computer readable medium storing instructions executable by a computer, the instructions comprising:
instructions that are executable by the computer to receive first data and receiving second data at a single memory cell that comprises a first multi-port non-volatile memory and a second multi-port non-volatile memory;
instructions that are executable by the computer to store the first data at a first resistive memory element of the first multi-port non-volatile memory; and
instructions that are executable by the computer to store the second data at a second resistive memory element of the second multi-port non-volatile memory, wherein the first multi-port non-volatile memory is associated with a first thread and the second multi-port non-volatile memory is associated with a second thread.

29. The computer readable medium of claim 28, wherein the instructions are executable by a processor integrated in a device selected from a group consisting of a set top box, a music player, a video player, an entertainment unit, a navigation device, a communication device, a personal digital assistant (PDA), a fixed location data unit, and a computer.

30. A method comprising:
receiving design information representing at least one physical property of a semiconductor device, the semiconductor device including a plurality of memory cells, wherein at least one of the memory cells comprises:
a first multi-port non-volatile memory including a first resistive memory element; and
a second multi-port non-volatile memory including a second resistive memory element;
transforming the design information to comply with a file format, wherein the data file includes a GDSII format; and
generating a data file including the transformed design information.

31. A method comprising:
receiving a data file including design information corresponding to a semiconductor device, wherein the data file has a GDSII format; and
fabricating the semiconductor device according to the design information, wherein the semiconductor device includes:
a first multi-port non-volatile memory including a first resistive memory element; and
a second multi-port non-volatile memory including a second resistive memory element.

32. A method comprising:
receiving design information including physical positioning information of a packaged semiconductor device on a circuit board, the packaged semiconductor device including a semiconductor structure comprising:
a first multi-port non-volatile memory including a first resistive memory element; and
a second multi-port non-volatile memory including a second resistive memory element;
transforming the design information to generate a data file, wherein the data file has a GERBER format.

33. A method comprising:
receiving a data file including design information including physical positioning information of a packaged semiconductor device on a circuit board, wherein the data file has a GERBER format; and
manufacturing the circuit board configured to receive the packaged semiconductor device according to the design information, wherein the packaged semiconductor device comprises:
a first multi-port non-volatile memory including a first resistive memory element; and
a second multi-port non-volatile memory including a second resistive memory element.

34. The method of claim 33, further comprising integrating the circuit board into a device selected from the group consisting of a set top box, a music player, a video player, an entertainment unit, a navigation device, a communication device, a personal digital assistant (PDA), a fixed location data unit, and a computer.

35. A memory device comprising:
a plurality of memory cells, wherein at least one of the memory cells comprises:
a first non-volatile memory including a first resistive memory element; and
a second non-volatile memory including a second resistive memory element, wherein the first non-volatile memory and the second non-volatile memory each include multiple ports.

36. The memory device of claim 35, wherein multiple bit lines and multiple sense lines couple the first non-volatile memory to the second non-volatile memory and wherein at least one of the multiple bit lines and the multiple sense lines is usable in both read and write operations of the first non-volatile memory and the second non-volatile memory.

37. The system of claim 12, wherein multiple hit lines and multiple sense lines couple the first non-volatile memory to the second non-volatile memory and wherein at least one of the multiple bit lines and the multiple sense lines is usable in both read and write operations of the first non-volatile memory and the second non-volatile memory.

38. The method of claim 30, wherein multiple hit lines and multiple sense lines couple the first multi-port non-volatile memory to the second multi-port non-volatile and wherein at least one of the multiple bit lines and the multiple sense lines is usable in both read and write operations of the first multi-port non-volatile memory and the second multi-port non-volatile memory.

39. The method of claim 31, wherein multiple bit lines and multiple sense lines couple the first multi-port non-volatile memory to the second multi-port non-volatile and wherein at least one of the multiple bit lines and the multiple sense lines is usable in both read and write operations of the first multi-port non-volatile memory and the second multi-port non-volatile memory.

40. The method of claim 32, wherein multiple bit lines and multiple sense lines couple the first multi-port non-volatile memory to the second multi-port non-volatile and wherein at least one of the multiple bit lines and the multiple sense lines is usable in both read and write operations of the first mufti-port non-volatile memory and the second multi-port non-volatile memory.

41. The method of claim 33, wherein multiple bit lines and multiple sense lines couple the first multi-port non-volatile memory to the second multi-port non-volatile and wherein at least one of the multiple bit lines and the multiple sense lines is usable in both read and write operations of the first multi-port non-volatile memory and the second multi-port non-volatile memory.

* * * * *